US012633370B2

(12) United States Patent
Hung et al.

(10) Patent No.: US 12,633,370 B2
(45) Date of Patent: May 19, 2026

(54) REPAIRING DEFECTIVE COLUMNS OF COMPUTE-IN-MEMORY AND NEAR-MEMORY COMPUTING DEVICES

(71) Applicant: MACRONIX INTERNATIONAL CO., LTD., Hsinchu (TW)

(72) Inventors: Chun-Hsiung Hung, Hsinchu (TW); Hsin-Yi Ho, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 78 days.

(21) Appl. No.: 18/755,329

(22) Filed: Jun. 26, 2024

(65) Prior Publication Data

US 2026/0004870 A1 Jan. 1, 2026

(51) Int. Cl.
| | |
|---|---|
| *G11C 16/06* | (2006.01) |
| *G11C 11/54* | (2006.01) |
| *G11C 29/00* | (2006.01) |

(52) U.S. Cl.
CPC ............ *G11C 29/702* (2013.01); *G11C 11/54* (2013.01); *G11C 29/789* (2013.01)

(58) Field of Classification Search
CPC ...... G11C 29/702; G11C 29/789; G11C 11/54
USPC ................................... 365/185.09
See application file for complete search history.

(56) References Cited

U.S. PATENT DOCUMENTS

| | | | |
|---|---|---|---|
| 5,126,973 A | | 6/1992 | Gallia et al. |
| 5,502,645 A | * | 3/1996 | Guerra .................... G06F 30/30 |
| | | | 716/135 |
| 5,537,665 A | | 7/1996 | Patel et al. |
| 5,862,059 A | * | 1/1999 | Matula ................... G06F 7/4824 |
| | | | 708/654 |
| 6,084,807 A | | 7/2000 | Choi |
| 6,157,584 A | | 12/2000 | Holst |

(Continued)

FOREIGN PATENT DOCUMENTS

| | | | | |
|---|---|---|---|---|
| CN | 106775577 A | * | 5/2017 | ........... G06F 7/5332 |
| CN | 110377875 A | * | 10/2019 | ............. G06F 17/16 |

(Continued)

OTHER PUBLICATIONS

Kim, et al., "Built in self repair for embedded high density SRAM," Proceedings International Test Conference 1998, Washington, DC, USA, Oct. 18-23, 1998, pp. 1112-1119.

*Primary Examiner* — Viet Q Nguyen
(74) *Attorney, Agent, or Firm* — Andrew L. Dunlap; Haynes Beffel & Wolfeld LLP

(57) ABSTRACT

A compute-in-memory (CIM) device is provided. The CIM device includes control circuits providing N input data elements and M redundancy input data elements, N and M being greater than zero, multiplier circuits configured to (i) multiply N input data elements by N stored data elements and (ii) provide a multiplier output, and redundancy multiplier circuits configured to (i) multiply the M redundancy input data elements by M stored redundant data elements and (ii) provide a redundancy multiplier output, wherein the control circuits provide (i) the N input data elements to the multiplier circuits and (ii) the M redundancy input data elements with a value of zero to the redundancy multiplier circuits, such that the redundancy multiplier circuits provide a redundancy multiplier output of zero, regardless of a value of the M stored redundant data elements.

20 Claims, 6 Drawing Sheets

$(\sum_{i=0}^{n} Ai * Wi) + (RA0*RW0)+(RAm*RWm)$

(56) References Cited

U.S. PATENT DOCUMENTS

| | | | | |
|---|---|---|---|---|
| 6,185,136 | B1 | | 2/2001 | Shirley |
| 6,665,220 | B2 | | 12/2003 | Vlasenko |
| 6,738,942 | B1 * | | 5/2004 | Sridharan ............. H03M 13/29 |
| | | | | 714/755 |
| 7,240,237 | B2 | | 7/2007 | Delaney |
| 7,251,173 | B2 | | 7/2007 | Lunde et al. |
| 7,266,580 | B2 * | | 9/2007 | Busaba ................. G06F 7/5324 |
| | | | | 708/628 |
| 8,111,578 | B2 | | 2/2012 | Bollu |
| 8,380,767 | B2 * | | 2/2013 | Ozturk .................... G06F 7/724 |
| | | | | 708/492 |
| 8,380,777 | B2 * | | 2/2013 | Ozturk .................... G06F 7/724 |
| | | | | 708/492 |
| 8,549,055 | B2 * | | 10/2013 | Streicher ................. G06F 17/10 |
| | | | | 708/203 |
| 8,976,604 | B2 | | 3/2015 | Hung |
| 9,627,094 | B2 | | 4/2017 | Yano |
| 9,720,646 | B2 * | | 8/2017 | Burgess ................. G06F 7/483 |
| 9,733,899 | B2 * | | 8/2017 | Lutz .................... G06F 9/30014 |
| 9,773,571 | B2 | | 9/2017 | Lo et al. |
| 9,858,146 | B2 | | 1/2018 | Moertl et al. |
| 9,864,546 | B1 | | 1/2018 | Kovishaner |
| 11,567,731 | B2 * | | 1/2023 | Lin ......................... G06N 3/063 |
| 11,694,762 | B2 | | 7/2023 | Wieduwilt et al. |
| 11,815,995 | B1 | | 11/2023 | Liang et al. |
| 12,197,888 | B2 * | | 1/2025 | Langhammer .......... G06F 7/523 |
| 12,360,845 | B2 * | | 7/2025 | Sethumadhavan .......................... |
| | | | | G06F 11/1044 |
| 2001/0026481 | A1 | | 10/2001 | Shirley |
| 2006/0080572 | A1 | | 4/2006 | Fong |
| 2017/0270017 | A1 | | 9/2017 | Li |
| 2021/0096953 | A1 | | 4/2021 | Kotzur et al. |
| 2022/0100622 | A1 | | 3/2022 | Park et al. |
| 2022/0351761 | A1 | | 11/2022 | Yang et al. |

FOREIGN PATENT DOCUMENTS

| | | | | | |
|---|---|---|---|---|---|
| CN | 115826913 | A | * | 3/2023 | |
| KR | 20160085873 | A | * | 7/2016 | .......... G06F 9/3888 |
| TW | 202032363 | A | | 9/2020 | |
| TW | 202143166 | A | * | 11/2021 | .......... G06N 3/0499 |
| WO | 2021223547 | A1 | | 11/2021 | |

* cited by examiner $$\left(\sum_{i=0}^{n} Ai * Wi\right) + (RA0*RW0) + (RAm*RWm)$$

REPAIRING DEFECTIVE COLUMNS OF COMPUTE-IN-MEMORY AND NEAR-MEMORY COMPUTING DEVICES

BACKGROUND

Field

The technology disclosed relates to circuitry usable to perform in-memory or near-memory-computation, such as multiply-and-accumulate (MAC) or other sum-of-products like operations. More specifically, the technology disclosed relates to repairing defective columns in compute-in-memory and near-memory-computing devices having redundancy components.

Description of Related Art

In neuromorphic computing systems, machine learning systems and circuitry used for some types of computations based on linear algebra, the multiply-and-accumulate or sum-of-products functions can be important components. Such functions can be expressed as follows:

$$f(X_i) = \sum_{i=1}^{M} W_i X_i$$

In this expression, each product term is a product of a variable input $X_i$ (e.g., an input data element) and a weight $W_i$ (e.g., a stored data element). The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function.

These architectures can be implemented in static random access memory (SRAM) or dynamic random access memory (DRAM) based digital computing-in-memory (dCIM) systems and as digital near-memory-computing (dNMC) systems to carry out multiply and accumulate (MAC) operations, as described in the formula above.

The memory arrays for these CIM systems can be extremely large and can have expected number of columns having defects, such as bad blocks (cells), meaning that all columns may not be healthy. For example, during mass production of memory chips there might be physical defects or incomplete photo resistance etching that causes failure when using certain portions (e.g., a particular column) of the memory. Furthermore, due to use of blocks or cells, over time the number of defects or failures can increase. Conventional column redundancy repair schemes require a significant amount of additional circuitry, which increases the space required by the CIM systems. Further, conventional column redundancy repair schemes slow down the processing time of the CIM systems, because additional time is needed to account for the operations performed by the additional circuitry.

Therefore, it is desirable to provide digital CIM and NMC systems that implement column redundancy repair schemes that to not require a significant amount of additional circuitry.

SUMMARY

The present technology provides a compute-in-memory device that includes control circuits that can provide N input data elements and M redundancy input data elements, N and M being integers greater than zero, multiplier circuits that can be configured to (i) multiply the N input data elements by N stored data elements and (ii) provide a multiplier output, and redundancy multiplier circuits that can be configured to (i) multiply the M redundancy input data elements by M stored redundant data elements and (ii) provide a redundancy multiplier output, wherein the control circuits can include logic to execute operations can include providing (i) the N input data elements to the multiplier circuits and (ii) the M redundancy input data elements with a value of zero to the redundancy multiplier circuits, such that the redundancy multiplier circuits provide a redundancy multiplier output of zero, regardless of a value of the M stored redundant data elements.

In an embodiment, the compute-in-memory device can further include accumulation circuitry that can receive the multiplier output and the redundancy multiplier output and configured to generate a sum of (i) data elements of the received multiplier output and (ii) data elements of the received redundancy multiplier output.

In a further embodiment, the compute-in-memory device can include operations that, responsive to an indication of a defective column provide, to a redundancy multiplier circuit of the redundancy multiplier circuits, a value of a particular input data element originally allocated to a multiplier circuit, of the multiplier circuits, connected to the defective column, and provide a value of zero as an input data element to the multiplier circuit connected to the defective column.

In another embodiment, the compute-in-memory device can include an array of N memory cells storing the N stored data elements and including the defective column, and an array of M redundant memory cells storing the M stored redundant data elements, wherein a data element of the N stored data elements originally addressed to a memory cell, of the N memory cells, that is connected to the defective column can be provided to a redundant memory cell of the M redundant memory cells as a redundant data element of the M stored redundant data elements, and wherein the redundancy multiplier circuit can (i) multiply the redundant data element of the redundant memory cell by the value of the particular input data element originally allocated to the multiplier circuit connected to the defective column and (ii) provide a product of the multiplication as a data element of the redundancy multiplier output.

In an embodiment, the array of N memory cells can include static random access memory (SRAM).

In a further embodiment, the array of N memory cells can include dynamic random access memory (DRAM).

In another embodiment, the array of N memory cells can include non-volatile memory.

In an embodiment, the compute-in-memory device can include accumulation circuitry receiving the multiplier output and the redundancy multiplier output and configured to generate a sum of data elements of the received multiplier output and data elements of the received redundancy multiplier output.

In an embodiment, the control circuits can include buffers for storing values of the N input data elements and values of the M redundancy input data elements, and the operations can include changing the values of the N input data elements and the values of the M redundancy input data elements in dependence upon the indication of the defective column.

In a further embodiment, the N input data elements can be activator inputs of a neural network and the N stored data elements are weights of a neural network.

In another embodiment, the operations cab further include, responsive to an indication of two defective columns, providing, to a first redundancy multiplier circuit of the redundancy multiplier circuits, a value of a first particular input data element originally allocated to a multiplier circuit, of the multiplier circuits, connected to a first defective column of the two defective columns, providing, to a second redundancy multiplier circuit of the redundancy multiplier circuits, a value of a second particular input data element originally allocated to a multiplier circuit, of the multiplier circuits, connected to a second defective column of the two defective columns, and providing a value of zero as an input data element to the multiplier circuit connected to the first defective column and to the multiplier circuit connected to the second defective column.

In an embodiment, a method of performing operations using a compute-in-memory device is provided. The compute-in-memory device can include (i) control circuits providing N input data elements and M redundancy input data elements, N and M being integers greater than zero, (ii) multiplier circuits configured to multiply the N input data elements by N stored data elements and provide a multiplier output, and (iii) redundancy multiplier circuits configured to multiply the M redundancy input data elements by M stored redundant data elements and provide a redundancy multiplier output. The method can include providing the N input data elements to the multiplier circuits, and providing the M redundancy input data elements with a value of zero as an input data element to the redundancy multiplier circuits, such that the redundancy multiplier circuits provide a redundancy multiplier output of zero, regardless of a value of the M stored redundant data elements.

In a further embodiment, the method can include generating a sum of (i) data elements of the multiplier output and (ii) data elements of the redundancy multiplier output.

In another embodiment the method can include receiving an indication that there is a defective column in a memory array of the compute-in-memory device, providing, to a redundancy multiplier circuit of the redundancy multiplier circuits, a value of a particular input data element originally allocated to a multiplier circuit, of the multiplier circuits, connected to the defective column, and providing a value of zero as an input data element to the multiplier circuit connected to the defective column.

In an embodiment, the compute-in-memory device can further include an array of N memory cells storing the N stored data elements and including the defective column, and an array of M redundant memory cells storing the M stored redundant data elements. Further, the method can further include providing a data element, of the N stored data elements, originally addressed to a memory cell of the N memory cells that is connected to the defective column to a redundant memory cell of the M redundant memory cells as a redundant data element of the M stored redundant data elements, multiplying, by the redundancy multiplier circuit, the redundant data element of the redundant memory cell by the value of the particular input data element originally allocated to the multiplier circuit connected to the defective column, and providing, by the redundancy multiplier circuit, a product of the multiplication as a data element of the redundancy multiplier output.

In an embodiment, the method can include receiving an indication that there are two defective columns in a memory array of the compute-in-memory device, providing, to a first redundancy multiplier circuit of the redundancy multiplier circuits, a value of a first particular input data element originally allocated to a multiplier circuit, of the multiplier circuits, connected to a first defective column of the two defective columns, providing, to a second redundancy multiplier circuit of the redundancy multiplier circuits, a value of a second particular input data element originally allocated to a multiplier circuit, of the multiplier circuits, connected to a second defective column of the two defective columns, and providing a value of zero as an input data element to the multiplier circuit connected to the first defective column and to the multiplier circuit connected to the second defective column.

In another embodiment, a compute-in-memory device is provided. The compute-in-memory device can include control circuits providing N input data elements and M redundancy input data elements, N and M being integers greater than zero, multiplier circuits configured to (i) multiply the N input data elements by N stored data elements and (ii) provide a multiplier output, and redundancy multiplier circuits configured to (i) multiply the M redundancy input data elements by M stored redundant data elements and (ii) provide a redundancy multiplier output, wherein the control circuits can include logic to execute operations including, responsive to an indication of a defective column in a memory array storing stored data elements: providing, to a redundancy multiplier circuit of the redundancy multiplier circuits, a value of a particular input data element originally allocated to a multiplier circuit, of the multiplier circuits, connected to the defective column, and providing a value of zero as an input data element to the multiplier circuit connected to the defective column, such that the multiplier circuit connected to the defective column provides a multiplier output of zero for the defective column, regardless of a value of a stored data element of the defective column.

In a further embodiment, the compute-in-memory device can further include accumulation circuitry receiving the multiplier output and the redundancy multiplier output and configured to generate a sum of (i) data elements of the received multiplier output and (ii) data elements of the received redundancy multiplier output.

In an embodiment, the compute-in-memory device can further include an array of N memory cells storing the N stored data elements and including the defective column, and an array of M redundant memory cells storing the M stored redundant data elements, wherein a data element of the N stored data elements originally addressed to a memory cell, of the N memory cells, that is connected to the defective column can be provided to a redundant memory cell of the M redundant memory cells as a redundant data element of the M stored redundant data elements, and wherein the redundancy multiplier circuit can (i) multiply the redundant data element of the redundant memory cell by the value of the particular input data element originally allocated to the multiplier circuit connected to the defective column and (ii) provide a product of the multiplication as a data element of the redundancy multiplier output.

In another embodiment, the operations can further include, responsive to an indication of two defective columns: providing, to a first redundancy multiplier circuit of the redundancy multiplier circuits, a value of a first particular input data element originally allocated to a multiplier circuit, of the multiplier circuits, connected to a first defective column of the two defective columns, providing, to a second redundancy multiplier circuit of the redundancy multiplier circuits, a value of a second particular input data element originally allocated to a multiplier circuit, of the multiplier circuits, connected to a second defective column of the two defective columns, and providing a value of zero as an input data element to the multiplier circuit connected to the first defective column and to the multiplier circuit connected to the second defective column.

Other aspects and advantages of the present invention can be seen on review of the drawings, the detailed description and the claims, which follow.

DETAILED DESCRIPTION

A detailed description of embodiments of the present invention is provided with reference to the FIGS. 1-6.

Figure 1:
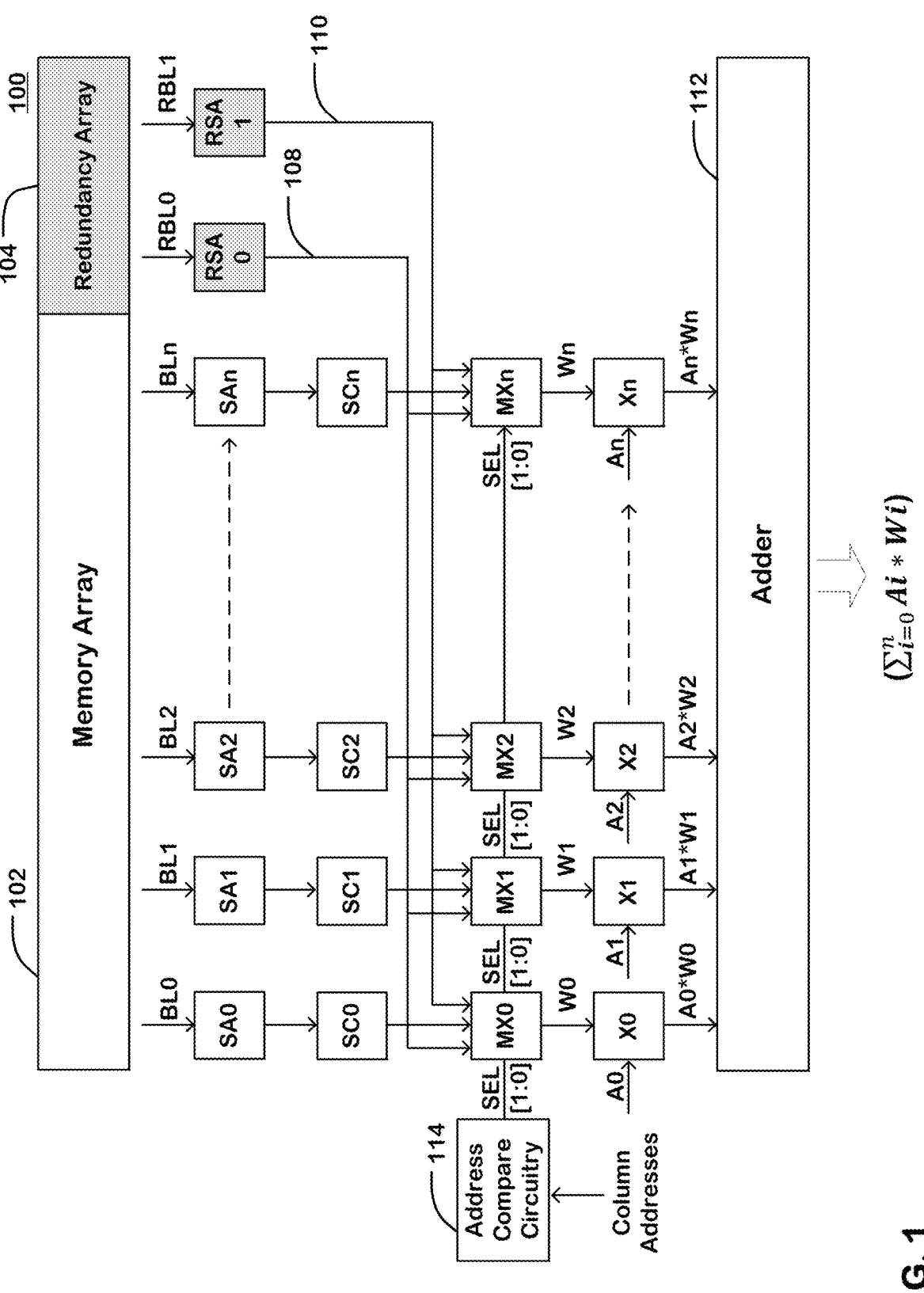
FIG. 1 illustrates a column redundancy repair scheme that requires additional multiplexer and control circuitry, as implemented by a compute-in-memory (CIM) system for performing multiply and accumulate (MAC) operations.

FIG. 1 illustrates a column redundancy repair scheme that requires additional multiplexer and control circuitry, as implemented by a compute-in-memory (CIM) system for performing multiply and accumulate (MAC) operations.

Specifically, FIG. 1 illustrate a CIM system 100 that performs MAC operations. The CIM system 100 includes a memory array 102 and a redundancy array 104. The memory array 102 can store data elements that are used as weights for performing MAC operations in neuromorphic computing systems. The data elements stored by the memory array 102 can be provided to bitlines BL0, BL1, BL2 through BLn (n being an integer greater than zero; in this example n would be an integer greater than 2). Each bitline provides a data element to a corresponding sense amplifier SA0, SA1, SA2, through San, such that a data element provided on bitline BL0 is provided to sense amplifier SA0, a data element provided on bitline BL1 is provided to sense amplifier SA1, a data element provided on bitline BL2 is provided to sense amplifier SA2 and a data element provided on bitline BLn is provided to sense amplifier San.

Further, sense amplifier SA0 can be connected to and provide a data element to storage circuitry SC0 so as to program storage circuitry SC0 with the data element, sense amplifier SA1 can be connected to and provide a data element to storage circuitry SC1 so as to program storage circuitry SC1 with the data element, sense amplifier SA2 can be connected to and provide a data element to storage circuitry SC2 so as to program storage circuitry SC2 with the data element and sense amplifier San can be connected to and provide a data element to storage circuitry SCn so as to program storage circuitry SCn with the data element.

Storage circuitry SC0 can be connected to and provide a stored data element to multiplexer circuitry MX0, storage circuitry SC1 can be connected to and provide a stored data element to multiplexer circuitry MX1, storage circuitry SC2 can be connected to and provide a stored data element to multiplexer circuitry MX2 and storage circuitry SCn can be connected to and provide a stored data element to multiplexer circuitry MXn.

Multiplier circuit X0 can (i) be connected to and receive an output from the multiplexer circuitry MX0, such as weight output (data element) W0, (ii) receive input data elements, such as input data element A0, allocated thereto (iii) multiply (or be configured to multiply) the output W0 from the multiplexer circuitry MX0 by the input data element A0, (iv) and provide an output, which is the result of A0\*W0. In a similar manner, multiplier circuit X1 can (i) be connected to and receive an output from the multiplexer circuitry MX1, such as weight output (data element) W1, (ii) receive input data elements, such as input data element A1, allocated thereto, (iii) multiply (or be configured to multiply) the output W1 from the multiplexer circuitry MX1 by input data element A1, (iv) and provide an output, which is the result of A1\*W1. Further, multiplier circuit X2 can (i) be connected to and receive an output from the multiplexer circuitry MX2, such as weight output (data element) W2 (ii) receive input data elements, such as input data element A2, allocated thereto, (iii) multiply (or be configured to multiply) the output W2 from the multiplexer circuitry MX2 by input data element A2, (iv) and provide an output, which is the result of A2\*W2. Also, multiplier circuit Xn can (i) be connected to and receive an output from the multiplexer circuitry MXn, such as weight output (data element) Wn, (ii) receive input data elements, such as input data element An, allocated thereto, (iii) multiply (or be configured to multiply) the output Wn from the multiplexer circuitry MXn by input data element An, (iv) and provide an output, which is the result of An\*Wn. Other types of circuitry can replace the multiplier circuits X0, X1, X2 through Xn, such as circuits that perform other mathematical operations including division, addition, subtraction, etc.

As illustrated, a column of the CIM system 100 can include (or be connected to) bitline BL0, storage circuitry SC0, multiplexer circuitry MX0 and multiplier circuit MX0. Any one of the components of the column can become defective, such as the storage circuitry SC0. In this illustration, there are n (storage) columns that collectively represent an array of n memory/storage cells (e.g., storage circuitry SC0, SC1, SC2 through SCn). This collective array of n memory/storage cells can store n stored data elements that are received from the memory array 102.

FIG. 1 illustrates an approach to providing redundancy columns to account for (e.g., be implemented to repair) defective columns. In this example, the redundancy array 104 provides redundant data elements on redundancy bitlines, such that a redundancy data element is provided on redundancy bitline RBL0 and another redundancy data element is provided on redundancy bitline RBL1. A CIM system 100 is not limited to a specific number of redundancy columns and this example includes two redundancy columns just for the sake of simplicity. Each redundancy column can include a redundancy sense amplifier, such as redundancy sense amplifier RSA0 and redundancy sense amplifier RSA1. Redundancy sense amplifier RSA0 can provide a data element on line 108 and redundancy sense amplifier RSA1 can provide a data element on line 110. As illustrated, each of the multiplexer circuitry MX0, MX1, MX2 through MXn is connected to both of lines 108 and 110.

Accordingly, in dependence on select signal SEL [0] multiplexer circuitry MX0 is able to select, as an output (e.g., W0), (i) a data element received from storage circuitry SC0, (ii) a data element received from redundancy sense amplifier RSA0 on line 108 or (iii) a data element received from redundancy sense amplifier RSA1 on line 110. Similarly, in dependence on select signal SEL [1] multiplexer circuitry MX1 is able to select, as an output (e.g., W1), (i) a data element received from storage circuitry SC1, (ii) a data element received from redundancy sense amplifier RSA0 on line 108 or (iii) a data element received from redundancy sense amplifier RSA1 on line 110. Further, in dependence on select signal SEL [2] multiplexer circuitry MX2 is able to select, as an output (e.g., W2), (i) a data element received from storage circuitry SC2, (ii) a data element received from redundancy sense amplifier RSA0 on line 108 or (iii) a data element received from redundancy sense amplifier RSA1 on line 110. Also, in dependence on select signal SEL [n] multiplexer circuitry MXn is able to select, as an output (e.g., Wn), (i) a data element received from storage circuitry SCn, (ii) a data element received from redundancy sense amplifier RSA0 on line 108 or (iii) a data element received from redundancy sense amplifier RSA1 on line 110. If there are more redundancy columns, more complex multiplexer circuitry will be required, so as to be able to select from among the data elements received on the additional redundancy bitlines.

The redundancy array 104 can be programmed and can provide the redundant data elements to the redundancy bitlines RBL0 and RBL1 in dependence on which columns are determined to be defective. The memory array 102 and the redundancy array 104 can be part of the CIM system 100 or they can be separate from the CIM system 100.

The CIM system 100 can include address compare circuitry 114 that controls the multiplexer circuitry MX0, MX1, MX2 through MXn to select one of (i) the stored data element stored by the storage circuitry SC0, SC1, SC2 through SCn, (ii) a stored redundant data element provided by redundancy bitline RBL0 and (iii) a stored redundant data element provided by redundancy bitline RBL1. The address compare circuitry 114 can control the multiplexer circuitry MX0, MX1, MX2 through MXn by providing select signals (e.g., SEL [1:0]) to multiplexer circuits (e.g., MX0, MX1, MX2 through MXn). For example, two select signals SEL [1:0] can be provided to all multiplexer circuits MX0 through MXn). As illustrated throughout the figures described herein, a single line or connection can represent multiple lines and connections, such that, for example, select signals can be sent over multiple lines and/or connections, not just a single line as illustrated. If a particular column is defective (e.g., the column associated with bitline BL0), then the address compare circuitry 114 will select, using the select signals SEL [1:0], one of the stored redundant data elements provided by redundancy bitline RBL0 and the stored redundant data element provided by redundancy bitline RBL1 based on column address information associated with storage circuitry SC0 and/or the data element addressed or allocated to storage circuitry SC0. The address compare circuitry 114 can do this by comparing column addresses of data elements to known addresses of defective columns and determining which redundancy bitlines RBL0 or RBL1 are allocated to provide data elements addressed or allocated to the defective columns. For example, this can be accomplices by using multiple XNOR gages to compare stored (known) defective addresses to input addresses. This technique can bypass the use of defective storage circuitry SC0 and utilize whichever of redundancy bitlines RBL0 or RBL1 can provide the same data element value of the data originally addressed or allocated to storage circuitry SC0. If a particular column does not have a defect, then the address compare circuitry 114 can control the corresponding multiplexer circuitry to provide the stored data element stored by the storage circuitry to the multiplier circuitry. For example, if the column connected to bitline BL1 is not defective, then the address compare circuitry 114 will control multiplexer circuitry MX1 to provide the stored data element from storage circuitry SC1 to multiplier circuitry X1 for carrying out a multiplication operation of A1*W1.

The data elements can be provided from the memory array 102 and the redundancy array 104 with or without the sense amplifiers and/or the redundancy sense amplifiers.

The CIM system 100 also includes an adder 112 (e.g., accumulation circuitry) that accumulates the outputs of each of the columns. For example, the adder 112 accumulates/adds the results of A0*W0, A1*W1, A2*W2 through An*Wn. As a result, the output of the adder 112 is the mathematical equivalent of $$\sum_{i=0}^{n} Ai * Wi.$$

As illustrated, every column of the memory array of n storage components requires a multiplexer and address compare circuitry 114 is required to control every multiplexer. The space taken up by the multiplexer circuitry and the address compare circuitry 114 and the additional operations required to control the multiplexer circuitry is undesirable and results in an unnecessarily large and slow CIM system.

Figure 2:
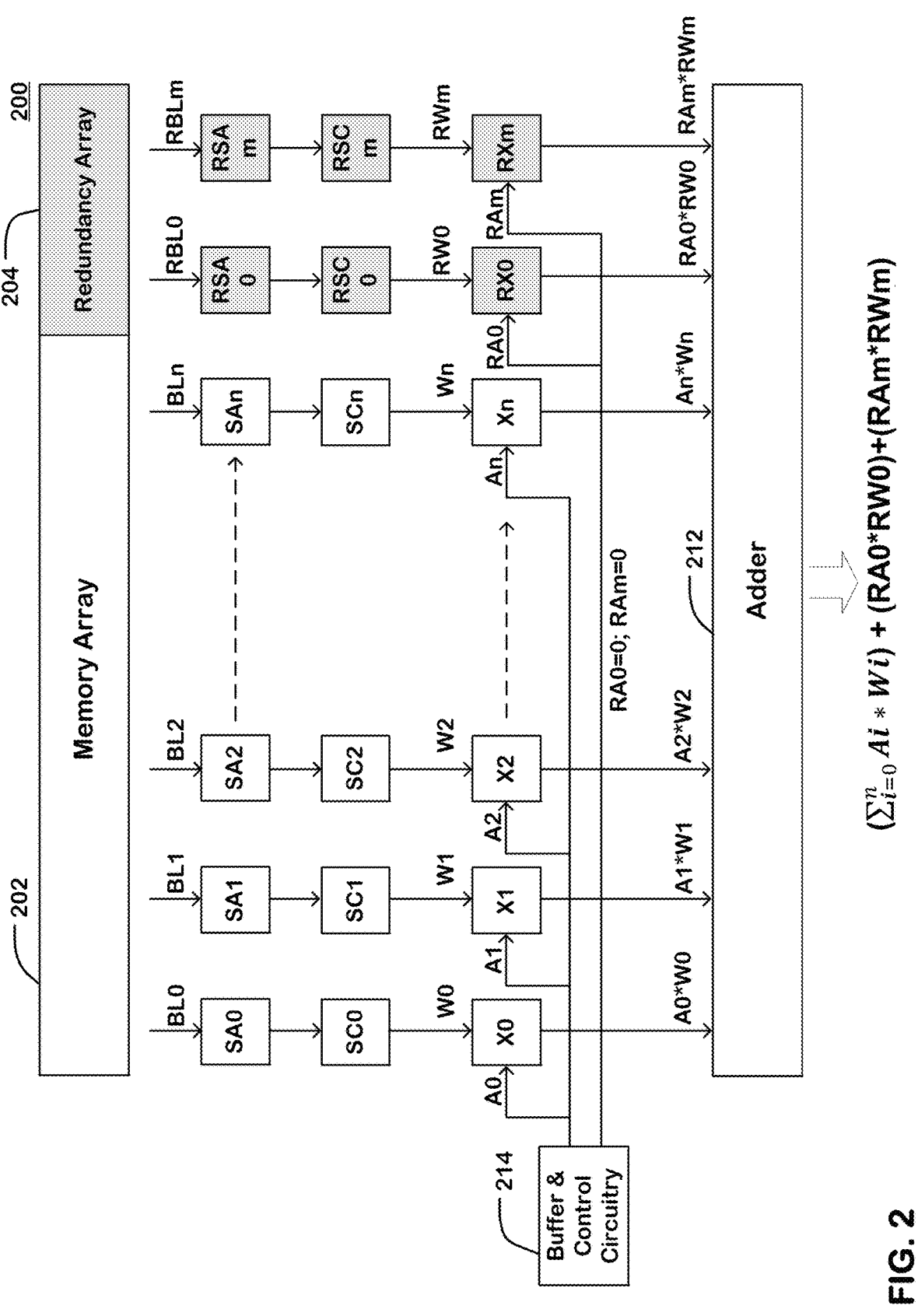
FIG. 2 illustrates a column redundancy repair scheme when there are no defective columns or when there is a determination that there is no need to access a redundancy array and that requires less additional circuitry (as compared to FIG. 1), as implemented by a CIM system for performing MAC operations.

FIG. 2 illustrates a column redundancy repair scheme when there are no column defects and that requires less additional circuitry (compared to FIG. 1), as implemented by a CIM system for performing MAC operations.

Specifically, FIG. 2 illustrates a CIM system 200 (or a compute-in-memory device) that includes memory array 202 and redundancy array 204. The memory array 202 and the redundancy array can include any type of storage circuitry such as non-volatile memory and volatile memory, such as static random access memory (SRAM) and/or dynamic random access memory (DRAM). FIG. 2 is similar to FIG. 1, in that it illustrates bitlines BL0, BL1, BL2 through BLn, redundancy bitlines RBL0 and RBLm, sense amplifiers SA0, SA1, SA2 through San, redundancy sense amplifiers RSA0 and RSAm, storage circuitry SC0, SC1, SC2 through SCn, multiplier circuits X0, X1, X2 through Xn and adder 212 (e.g., accumulation circuitry), where m is an integer greater than zero and in this specific example m is equal to two, since there are two redundancy bitlines RBL0 and RBLm. Sense amplifiers SA0, SA1, SA2 through San and redundancy sense amplifiers RSA0 through RSAm are optional.

The CIM system 200 of FIG. 2 is different from the CIM system 100 of FIG. 1, in that the CIM system 200 does not include the multiplexer circuitry and the address compare circuitry 114. Additionally, the CIM system 200 includes buffer and control circuitry 214 (e.g., control circuits), redundancy storage circuitry RSC0 through RSCm (e.g., m redundant memory cells) and redundancy multiplier circuits RX0 through RXm that are configured to perform multiplication operations. Other types of circuitry can replace the multiplier circuits X0, X1, X2 through Xn and redundancy multiplier circuits RX0 through RXm, such as circuits that perform other mathematical operations including division, addition, subtraction, etc.

One redundancy column includes redundancy sense amplifier RSA0, redundancy storage circuitry RSC0 (e.g., a redundant memory cell) and a redundancy multiplier circuit RX0 and another redundancy column includes redundancy sense amplifier RSA1, redundancy storage circuitry RSCm (e.g., a redundant memory cell) and redundancy multiplier circuit RXm. As described above with respect to FIG. 1, the CIM system 200 is not limited to two redundancy columns.

As illustrated, the buffer and control circuitry 214 (e.g., control circuits) provides n input data elements (e.g., input data elements A0, A1, A2 through An) to multiplier circuits X0, X1, X2 through Xn. The buffer and control circuitry 214 also provides m redundancy input data elements RA0 through Ram, where m is an integer greater than zero and in this specific example m is equal to two, since there are two redundancy input data elements RA0 and Ram in FIG. 2.

Redundancy storage circuitry RSC0 (e.g., a redundant memory cell) can store a stored redundant data element (e.g., stored redundant data element RW0) that was addressed or allocated to storage circuitry of a defective column and redundancy storage circuitry RSCm (e.g., a redundant memory cell) can store a stored redundant data element (e.g., stored redundant data element RWm) that was addressed or allocated to storage circuitry of another defective column.

FIG. 2 illustrates a situation where there are no identified or detected defective columns or column failures in the CIM system 200. The terms defective, defects, failure and failures can be used interchangeably. When there are no identified or detected defective columns, the buffer and control circuitry 214 (e.g., control circuits) provides n input data elements A0 through An to the multiplier circuits X0 through Xn. Therefore, the multiplier circuits X0 through Xn can multiply (or be configured to multiply) the n stored data elements (e.g., weights W0 through Wn) by the input data elements A0 through An. The results of operations A0*W0, A1*W1, A2*W2, through An*Wn are provide to adder 212 (e.g., accumulation circuitry). Further, when there are no identified or detected defective columns, the redundancy input data element RA0 and the redundancy input data element Ram are set to have a value of zero. Therefore, the output of the redundancy multiplier circuits RX0 and RXm will be zero. As such, the output of the redundancy multiplier circuits RX0 and RXm will not affect or change the output of the adder 212. The output of the adder 212 will be the mathematical equivalent of $$\left( \sum\nolimits_{i=0}^{n} Ai * Wi \right) + (RA0 * RW0) + (RA1 * RW1),$$

where RA0 and Ram are zero. Essentially, any values stored in the storage circuitry of the redundancy columns are ignored because they are multiplied by zero when there are no defective columns. Throughout this document, the phrase "when there are no identified or detected defective columns" can also mean when there are no column failures and can also mean when there is a determination that there is no need to utilize the redundancy columns of the redundancy array 204. In other words, whether or not to utilize the redundancy columns of the redundancy array described herein can be based on (i) whether there are identified or detected defective columns, (ii) whether there are identified or detected column failures, (iii) whether there is a determined need to utilize the redundancy columns of the redundancy array or (iv) some other criteria.

The buffer and control circuitry 214 (e.g., control circuits) can include a buffer that stores the input data elements and logic to execute operations that include (when there is an indication of no defective columns and/or without an indication of defective columns) providing the n input data elements A0 through An to the n multiplier circuits X0 through Xn and providing m redundancy input data elements RA0 and RAm with a value of zero to the redundancy multiplier circuits RX0 and RXm, such that the redundancy multiplier circuits RX0 and RXm provide a redundancy multiplier output of zero, regardless of the values of the m stored redundant data elements RW0 and RWm. As illustrated, the adder 212 receives a multiplier output from the multiplier circuits X0 through Xn and a redundancy multiplier output from the redundancy multiplier circuits RX0 and RXm and is configured to generate a sum of data elements of the received multiplier output and data elements of the received redundancy multiplier output.

Figure 3:
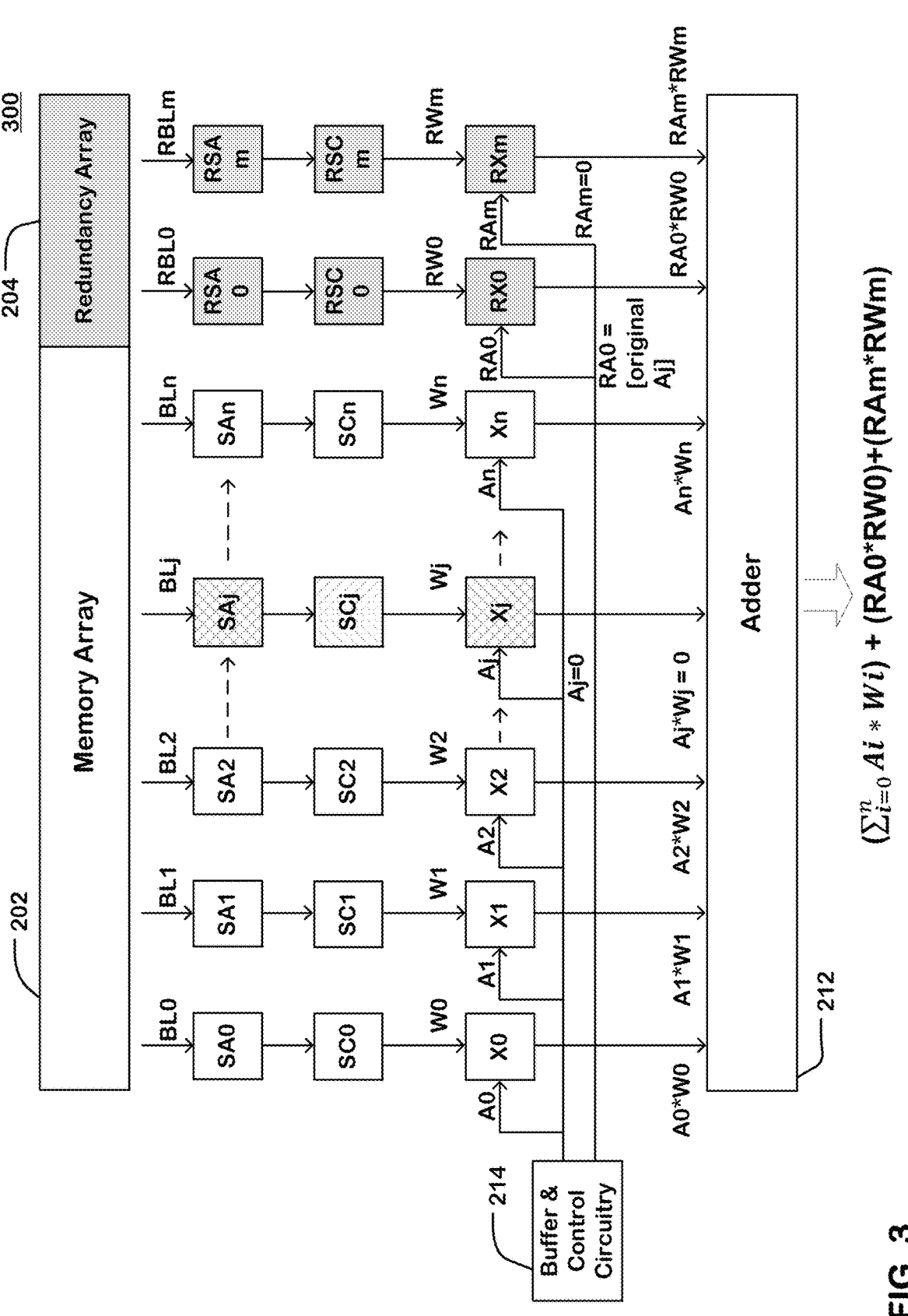
FIG. 3 illustrates a column redundancy repair scheme when there is a defective column as implemented by a CIM system for performing MAC operations.

FIG. 3 illustrates a column redundancy repair scheme when there is one column defect as implemented by a CIM system for performing MAC operations.

Specifically, FIG. 3 illustrates a CIM system 300 (or device) that is similar to the CIM system of FIG. 2, except that there is a defective column and as a result the buffer and control circuitry 214 (e.g., control circuits) causes the CIM system 300 to operate in a manner to repair the defective column. In this example, the CIM system 300 identifies the column associated with bitline BLj, sense amplifier SAj, storage circuitry SCj and multiplier circuit Xj as being defective.

As illustrated, the columns associated with bitlines BL0, BL1, BL2 and BLn operate in the same manner as discussed with respect to FIG. 2, such that (i) multiplier circuit X0 receives stored data element W0 and input data element A0, (ii) multiplier circuit X1 receives stored data element W1 and input data element A1, (iii) multiplier circuit X2 receives stored data element W2 and input data element A2, (iv) multiplier circuit Xn receives stored data element Wn and input data element An and (v) redundancy multiplier circuit RXm receives redundancy input data element RAm with a value of zero.

Because the column connected to bitline BLj is defective (e.g., responsive to an indication of the defective column), the buffer and control circuitry 214 (e.g., control circuits) provides redundancy multiplier circuit RX0 a value that was previously (originally) allocated to multiplier circuit Xj. In other words, redundancy multiplier circuit RX0 receives the original value of input data element Aj as redundancy input data element RA0. For example, if a value of "1" was originally allocated to multiplier circuit Xj of the defective column, the buffer and control circuitry 214, as a result of the identification of the defective column, provides the redundancy multiplier circuit RX0 with redundancy input data element RA0 having the value of "1", as originally allocated to the multiplier circuit Xj.

The value of the stored data element Wj originally addressed or allocated to storage circuitry SCj is also provided to redundancy bitline RBL0 so that it can be stored by redundancy storage circuitry RSC0 (e.g., a redundant memory cell). The value of the stored data element Wj originally address or allocated to the storage circuitry SCj can be provided to the redundancy array 204 and/or to redundancy bitline RBL0 using various techniques, such as using various cache arrays and lookup tables that can be implemented to route data to the various columns, so that data addressed to a defective column is written to redundancy columns having different addresses. These various techniques, or others, can be used to provide stored data elements to the redundancy columns described herein.

The stored data element RW0, which has the same value of the stored data element Wj as addressed or allocated to storage circuitry SCj, is provided from redundancy storage circuitry RSC0 (e.g., a redundant memory cell) to redundancy multiplier circuit RX0, such that the redundancy multiplier circuit RX0 multiplies the stored data element RW0 (the stored redundant data element) by the redundancy input data element RA0. Because the redundancy input data element RA0 has the same value originally allocated to the multiplier circuitry Xj of the defective column (RA0=original Aj) and because redundancy stored data element RW0 has the same value originally allocated to the storage circuitry SCj of the defective column (RW0=Wj), the output provided by redundancy multiplier circuit RX0 matches the value that should have been provided by the defective column. In other words, RA0*RW0 is the same as original Aj*Wj. The operations and output of redundancy column connected to redundancy bitline RBL0 essentially replace the operations and output of the defective column connected to bitline BLj.

Additionally, to prevent the defective column from outputting a value that will affect or change the result of the accumulation operations performed by the adder 212, the buffer and control circuitry 214 (e.g., control circuits) provides a value of zero as the input data element Aj to the multiplier circuit Xj connected to the defective column. Mathematically, this operation essentially shuts off the defective column because it will now always provide a value of zero to the adder 212. The output of the adder 212 will be the mathematical equivalent of $$\left(\sum\nolimits_{i=0}^{n} Ai * Wi\right) + (RA0 * RW0) + (RAm * RWm),$$

where the value of RA0 is the same as the value of the original Aj, the value of RW0 is the same as the value of Wj and the value of RAm is zero. Essentially, the value stored (or intended to be stored based on original addressing or allocation) in the defective column is ignored and the value stored in the (second) redundancy column connected to redundancy bitline RBLm is ignored.

Figure 4:
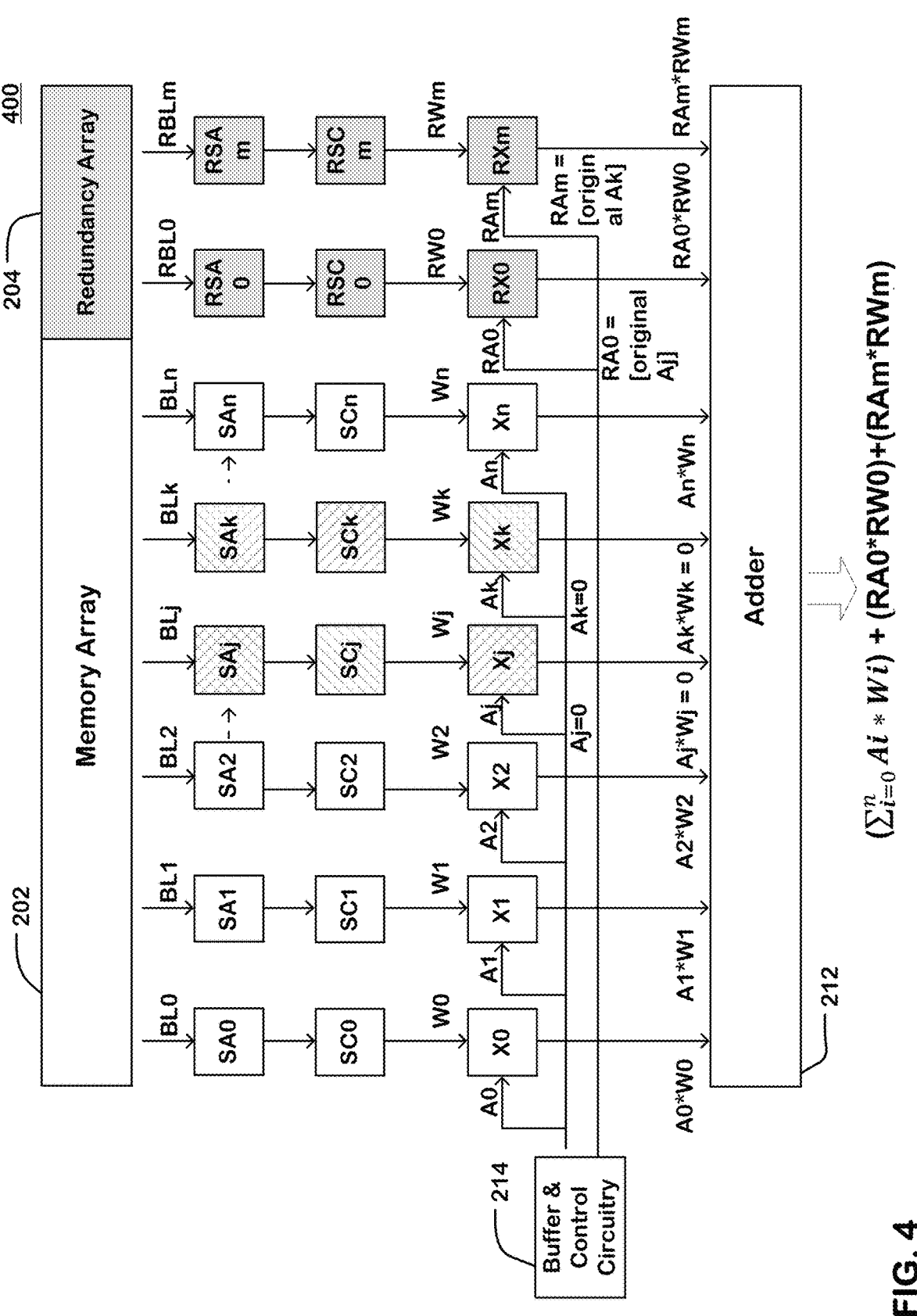
FIG. 4 illustrates a column redundancy repair scheme when there are at least two defective columns as implemented by a CIM system for performing MAC operations.

FIG. 4 illustrates a column redundancy repair scheme when there are at least two defective columns as implemented by a CIM system for performing MAC operations.

Specifically, FIG. 4 illustrates a CIM system 400 (or device) that is similar to the CIM system 300 of FIG. 3, except that there is another defective column and as a result the buffer and control circuitry 214 (e.g., control circuits) causes the CIM system 400 to operate in a manner to repair both defective columns.

Similar to FIG. 3, in this example, the CIM system 400 identifies the column associated with bitline BLj, sense amplifier SAj, storage circuitry SCj and multiplier circuits Xj as being defective. Additionally, the CIM system 400 identifies the column associated with bitline BLk, sense amplifier SAK, storage circuitry SCk and multiplier circuits Xk as being defective. The repair operation of the defective column associated with bitline BLk using the redundancy column associated with redundancy bitline RBL0 is the similar to that describe above with respect to the defective column associated with bitline BLj, except that the repair operation of the defective column associated with bitline BLk utilized the redundancy column associated with redundancy bitline RBLm. These operations are described in detail below.

The illustration of FIG. 4 is merely an example, and the value of m for the m redundancy columns can be determined depending on various factors associated with the CIM system 400. For example, the value of m can be determined based on the size and type of memory implemented in the CIM system 400, m can be increased or decreased, such that there are sufficient redundancy columns for the operating life of the CIM system 400. For example, the value of m can be determined based on a known or anticipated defect density of the CIM system 400.

As illustrated, the columns associated with bitlines BL0, BL1, BL2, BLj and BLn and redundancy bitline RBL0 operate in the same manner as discussed with respect to FIG. 3, such that (i) multiplier circuit X0 receives stored data element W0 and input data element A0, (ii) multiplier circuit X1 receives stored data element W1 and input data element A1, (iii) multiplier circuit X2 receives stored data element W2 and input data element A2, (iv) multiplier circuit Xn receives stored data element Wn and input data element An, and (v) multiplier circuit Xj receives input data element Aj with a value of 0.

Similar to the description of FIG. 3, because the column connected to bitline BLj is defective (e.g., responsive to an indication of the defective column), the buffer and control circuitry 214 (e.g., control circuits) provides redundancy multiplier circuit RX0 a value that was previously (originally) allocated to multiplier circuit Xj. In other words, redundancy multiplier circuit RX0 receives the original value of input data element Aj as redundancy input data element RA0. For example, if a value of "1" was originally allocated to multiplier circuit Xj of the defective column, the buffer and control circuitry 214, as a result of the identification of the defective column, provides the redundancy multiplier circuit RX0 with redundancy input data element RA0 having the value of "1", as originally allocated to the multiplier circuit Xj.

The value of the stored data element Wj originally addressed or allocated to storage circuitry SCj is also provided to redundancy bitline RBL0 so that it can be stored by redundancy storage circuitry RSC0 (e.g., a redundant memory cell). The value of the stored data element Wj originally address or allocated to the storage circuitry SCj can be provided to the redundancy array 204 and/or to redundancy bitline RBL0 using various techniques, such as using various cache arrays and lookup tables that can be implemented to route data to the various columns, so that data addressed to a defective column is written to redundancy columns having different addresses. These various techniques, or others, can be used to provide stored data elements to the redundancy columns described herein.

The stored data element RW0, which has the same value of the stored data element Wj as addressed or allocated to storage circuitry SCj, is provided from redundancy storage circuitry RSC0 (e.g., a redundant memory cell) to redundancy multiplier circuit RX0, such that the redundancy multiplier circuit RX0 multiplies the stored data element RW0 (the stored redundant data element) by the redundancy input data element RA0. Because the redundancy input data element RA0 has the same value originally allocated to the multiplier circuitry Xj of the defective column (RA0=original Aj) and because redundancy stored data element RW0 has the same value originally allocated to the storage circuitry SCj of the defective column (RW0=Wj), the output provided by redundancy multiplier circuit RX0 matches the value that should have been provided by the defective column. In other words, RA0*RW0 is the same as original Aj*Wj. The operations and output of redundancy column connected to redundancy bitline RBL0 essentially replace the operations and output of the defective column connected to bitline BLj.

Furthermore, because the column connected to bitline BLk is also defective, the buffer and control circuitry 214 (e.g., control circuits) provides redundancy multiplier circuit RXm a value that was previously (originally) allocated to multiplier circuit Xk. In other words, redundancy multiplier circuit RXm receives the original value of input data element Ak as redundancy input data element RAm. For example, if a value of "1" was originally allocated to multiplier circuit Xk of the defective column, the buffer and control circuitry 214, as a result of the identification of the defective column, provides the redundancy multiplier circuit RXm with redundancy input data element RAm having the value of "1", as originally allocated to multiplier circuit Xk. The value of the stored data element Wk originally addressed or allocated to storage circuitry SCk is also provided to redundancy bitline RBLm so that it can be stored by redundancy storage circuitry RSCm (e.g., a redundant memory cell). The stored data element RWm, which has the same value of the stored data element Wk as addressed or allocated to storage circuitry SCk, is provided from redundancy storage circuitry RSCm to redundancy multiplier circuit RXm, such that the redundancy multiplier circuit RXm multiplies the stored data element RWm (the stored redundant data element) by the redundancy input data element RAm.

Because the redundancy input data element RAm has the same value originally allocated to the multiplier circuit Xk of the defective column (RAm=original Ak) and because redundancy stored data element RWm has the same value originally addressed or allocated to the storage circuitry SCk of the defective column (RWm=Wk), the output provided by redundancy multiplier circuit RXm matches the value that should have been provided by the defective column. In other words, RAm*RWm is the same as original Ak*Wk. The operations and output of redundancy column connected to redundancy bitline RBLm essentially replace the operations and output of the defective column connected to bitline BLk.

Additionally, to prevent the defective columns from outputting a value that will affect or change the accumulation operations performed by the adder 212, the buffer and control circuitry 214 (e.g., control circuits) provides a value of zero as the input data element Ak to the multiplier circuit Xk connected to one of the defective columns and provides a value of zero as the input data element Aj to the multiplier circuit Xj connected to the other defective column. Mathematically, these operations essentially shut off the defective columns because they will now always provide a value of zero to the adder 212. The output of the adder 212 will be the mathematical equivalent of $$\left(\sum\nolimits_{i=0}^{n} Ai*Wi\right) + (RA0*RW0) + (RAm*RWm),$$

where the value of RA0 is the same as the value of the original Aj, the value of RW0 is the same as the value of Wj, the value of RAm is the same as the value of the original Ak, and the value of RWm is the same as the value of Wk. Essentially, the values stored (or intended to be stored based on original addressing or allocation) in the defective columns are ignored because Aj*Wj will always be zero as a result of Aj being zero and because Ak*Wk will always be zero as a result of Ak being zero.

The array of n memory cells (e.g., the array of storage circuitry SC0 through SCn) can include any type of storage circuitry, such as non-volatile memory and/or volatile memory, such as static random access memory (SRAM), dynamic random access memory (DRAM), latches, etc. The array of m memory cells (e.g., the array of redundancy storage circuitry RSC0 through RSCm) can include any type of storage circuitry, such as non-volatile memory and/or volatile memory, such as SRAM, DRAM, letches, etc. Further, the buffer and control circuitry 214 (e.g., control circuits) can include buffers for storing values of the n input data elements (e.g., A0 through An) and values of the m redundancy input data elements (e.g., RX0 through RXm), such that the operations performed by the buffer and control circuitry 214 include changing the values of the n input data elements and the m redundancy input data elements in dependence upon the detection and/or identification of one or more defective columns. The buffer and control circuitry 214 can include latches and/or SRAM cells (e.g., a block of latches and/or SRAM cells) to store values for A0 through An and to store values for RA0 through RAm, and can further include control circuitry (e.g., minimized control circuits that are as small as possible) to arrange output of A0 through An and RA0 through RAm. The n input data elements can be activator inputs of a neural network and the n stored data elements can be weights of the neural network.

Figure 5:
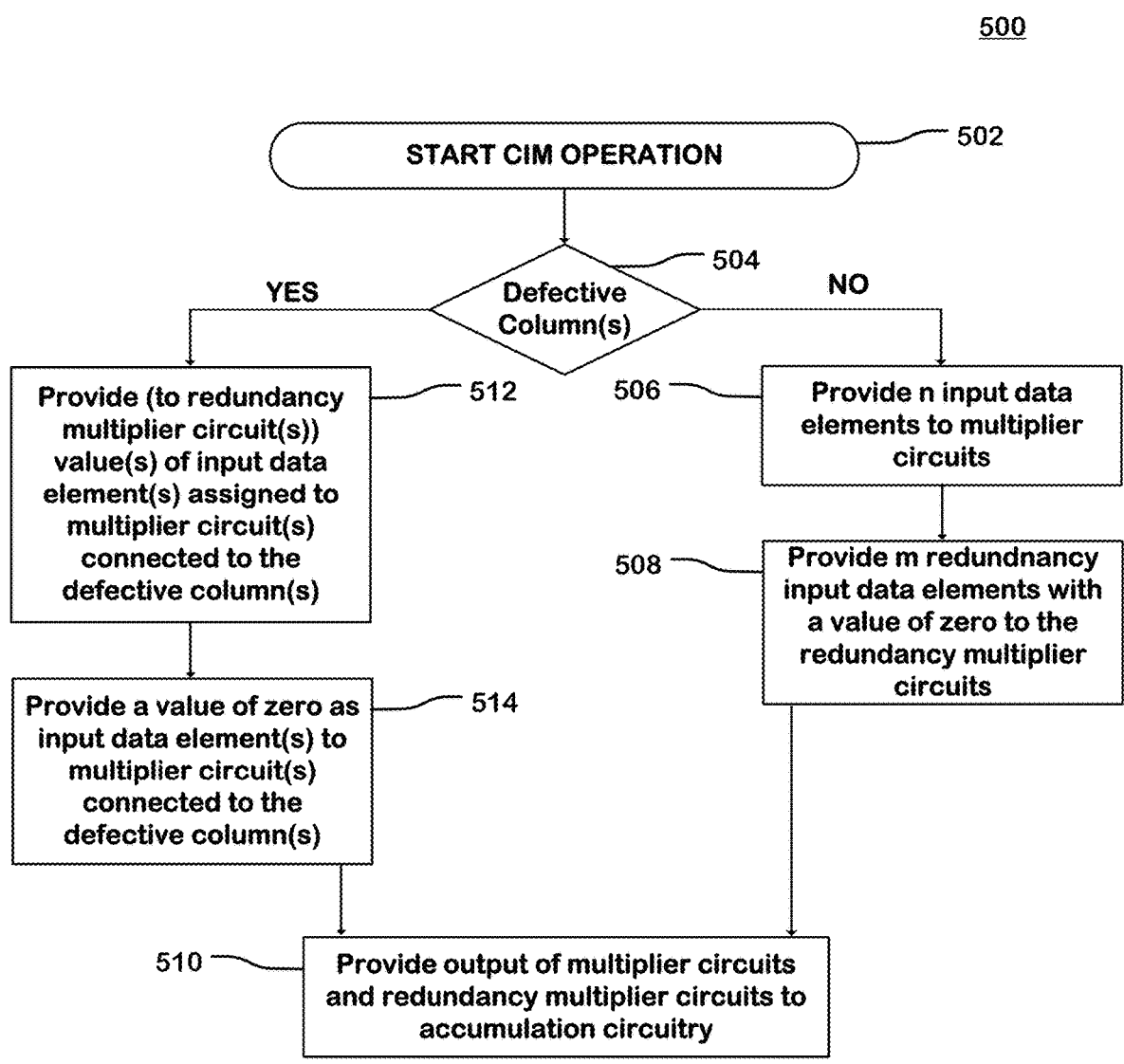
FIG. 5 illustrates a flowchart of implementing a column redundancy repair scheme, as implemented by a CIM system for performing MAC operations.

FIG. 5 illustrates a flowchart of implementing a column redundancy repair scheme, as implemented by a CIM system for performing MAC operations.

Specifically, FIG. 5 illustrates a flowchart 500 that identifies operations carried out with respect to the CIM repair operations discussed above with respect to FIGS. 2-4.

FIG. 5 illustrates operation 502 which includes starting a CIM operation that includes MAC operations. Operation 504 includes determining and/or obtaining an indication of whether or not there are any defective columns in the CIM system that performs the MAC operations. If at operation 504, there are no defective columns (or without an indication of the presence of defective columns), then operation 506 can provide n input data elements to the multiplier circuits and operation 508 can provide the m redundancy input data elements with a value of zero as input data elements to the redundancy multiplier circuits, such that the redundancy multiplier circuits provide a redundancy multiplier output of zero, regardless of a value of the m stored redundant data elements.

Operation 510 can provide an output of the multiplier circuits (multiplier output) and the redundancy multiplier circuit (redundancy multiplier output) to accumulation circuitry that generates a sum of (i) data elements of the multiplier output and (ii) data elements of the redundancy multiplier output.

If operation 504 determines that there are one or more defective columns, then operation 512 can provide (to redundancy multiplier circuit(s)) value(s) of input data element(s) assigned to multiplier circuit(s) connected to the defective column(s). If there is a single defective column, then operation 512 provides (to a redundancy multiplier circuit) a value of an input data element assigned to a multiplier circuit connected to the defective column. If there are multiple defective columns, then operation 512 provides (to redundancy multiplier circuits) values of input data elements assigned to multiplier circuits connected to the defective columns.

Further, operation 514 can provide a value of zero as an input data element(s) to multiplier circuit(s) connected to the defective column(s). If there is a single defective column, then operation 514 provides the value of zero as the input data element to the multiplier circuit connected to the defective column. If there are multiple defective columns, then operation 514 provides the value of zero as the input data elements to multiplier circuits connected to the defective columns. After operation 514, operation 510 can provide an output of the multiplier circuits (multiplier output) and the redundancy multiplier circuit (redundancy multiplier output) to accumulation circuitry that generates a sum of (i) data elements of the multiplier output and (ii) data elements of the redundancy multiplier output.

Figure 6:
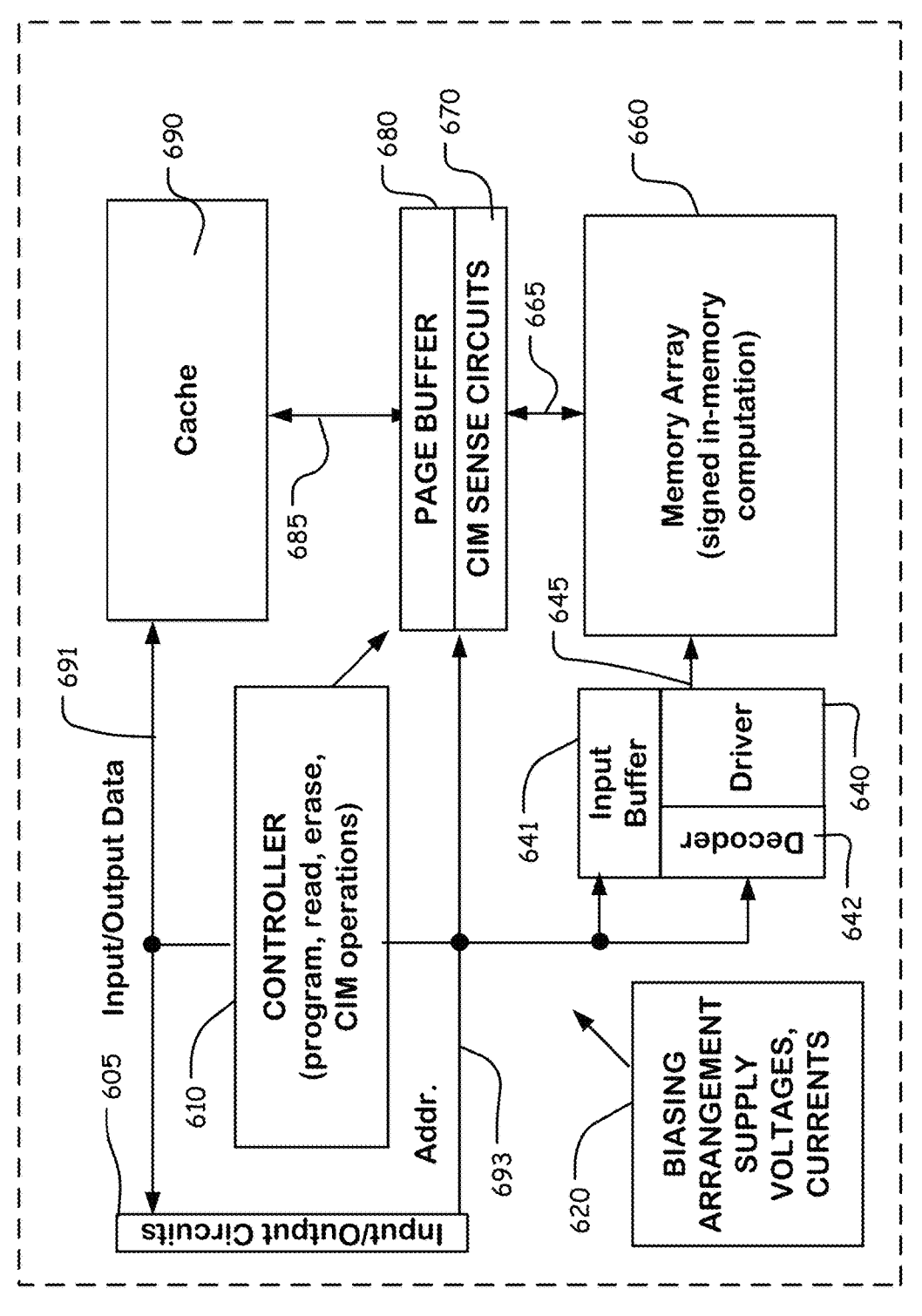
FIG. 6 illustrates a simplified block diagram of an integrated circuit device including a memory array arranged for in-memory computation with signed (or unsigned) inputs and weights.

FIG. 6 illustrates a simplified block diagram of an integrated circuit device including a memory array arranged for in-memory computation with signed (or unsigned) inputs and weights.

Specifically, FIG. 6 illustrates an integrated circuit device 600 including a memory array 660 arranged for signed, in-memory computation for a CIM operation, such as a signed (or unsigned), sum-of-products (MAC) operation, as performed by the CIM system/device described herein. The integrated circuit device 600 can implement the redundancy scheme described herein with respect to FIG. 1-2. The integrated circuit device 600 can be implemented on a single chip, or on a multichip module.

The device 600 includes input/output circuits 605 for communication of control signals, data, addresses and commands with other data processing resources, such as a CPU or memory controller.

Input/output data is applied on bus 691 to a controller 610, and to cache 690. Also, addresses are applied on bus 693 to a decoder 642, and to the controller 610. Also, the bus 691 and bus 693 can be operably connected to data sources internal to the integrated circuit device 600, such as a general purpose processor or special purpose application circuitry, or a combination of modules providing for example, system-on-a-chip functionality.

The memory array 660 can include an array of memory cells in a NOR architecture or in an AND architecture, such that memory cells are arranged in columns along bitlines and in rows along wordlines, and the memory cells in a given column are connected in parallel between a bitline and a source reference. The source reference can comprise a ground terminal or a source line connected to source side biasing resources. The memory cells can comprise charge trapping transistors cells, arranged in a 3D structure.

The bitlines can be connected by block select circuits to global bitlines 665, configured for selectable connection to a page buffer 680, and to CIM sense circuits 670.

The page buffer 680 in the illustrated embodiment is connected by bus 685 to the cache 690. The page buffer 680 includes storage elements and sensing circuits for memory operations, including read and write operations. For flash memory including dielectric charge trapping memory and floating gate charge trapping memory, write operations include program and erase operations.

A driver circuit 640 is coupled to wordlines 645 in the array 660, and applies wordline voltages to selected wordlines in response to a decoder 642 which decodes addresses on bus 693, or in a computation operation, in response to input data stored in input buffer 641.

The controller 610 is coupled to the cache 690 and the memory array 660, and to other peripheral circuits used in memory access and in memory computation operations.

Controller 610, using a for example a state machine, controls the application of supply voltages and currents generated or provided through the voltage supply or current sources in block 620, for memory operations and for CIM operations.

The controller 610 includes control and status registers, and control logic which can be implemented using special-purpose logic circuitry including state machines and combinational logic as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The array 660 includes memory cells arranged in columns and rows, where memory cells in columns are connected to corresponding bitlines, and memory cells in rows are connected to corresponding wordlines. The array 660 is programmable to store signed coefficients (weights Wi) in sets of memory cells.

In a CIM mode, the wordline driver circuit 640 includes drivers configured to drive signed inputs Xi by a select mode of voltages on selected wordlines and unselected wordlines from the input buffer 641. The CIM sense circuits 670 are configured to sense differences between first and second currents on respective bitlines in selected pairs of bitlines and to produce outputs for the selected pairs of bitlines as a function of the difference. The outputs can be applied to storage elements in the page buffer 680 and to the cache 690.

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Any data structures and code described or referenced above are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

An example of a processor is a hardware unit (e.g., comprising hardware circuitry such as one or more active devices) enabled to execute program code. Processors optionally comprise one or more controllers and/or state machines. Processors are implementable according to Application Specific Integrated Circuit (ASIC), Field-Programmable Gate Array (FPGA), and/or custom design techniques. Processors are manufacturable according to integrated circuit, optical, and quantum technologies. Processors use one or more architectural techniques such as sequential (e.g., Von Neumann) processing, Very Long Instruction Word (VLIW) processing. Processors use one or more microarchitectural techniques such as executing instructions one-at-a-time or in parallel, such as via one or more pipelines. Processors are directed to general purpose uses (and/or) special purpose uses (such as signal, audio, video, and/or graphics uses). Processors are fixed function or variable function such as according to programming. Processors comprise any one or more of registers, memories, logical units, arithmetic units, and graphics units. The term processor is meant to include processor in the singular as well as processors in the plural, such as multi-processors and/or clusters of processors.

The logic described herein can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

A number of flowcharts illustrating logic executed by a memory controller or by memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A compute-in-memory device, comprising:
control circuits providing N input data elements and M redundancy input data elements, N and M being integers greater than zero;
multiplier circuits configured to (i) multiply the N input data elements by N stored data elements and (ii) provide a multiplier output; and
redundancy multiplier circuits configured to (i) multiply the M redundancy input data elements by M stored redundant data elements and (ii) provide a redundancy multiplier output, wherein the control circuits include logic to execute operations including providing (i) the N input data elements to the multiplier circuits and (ii) the M redundancy input data elements with a value of zero to the redundancy multiplier circuits, such that the redundancy multiplier circuits provide a redundancy multiplier output of zero, regardless of a value of the M stored redundant data elements.

2. The compute-in-memory device of claim 1, further comprising an accumulation circuitry receiving the multiplier output and the redundancy multiplier output and configured to generate a sum of (i) data elements of the received multiplier output and (ii) data elements of the received redundancy multiplier output.

3. The compute-in-memory device of claim 1, wherein the operations further include, responsive to an indication of a defective column:
providing, to a redundancy multiplier circuit of the redundancy multiplier circuits, a value of a particular input data element originally allocated to a multiplier circuit, of the multiplier circuits, connected to the defective column; and
providing a value of zero as an input data element to the multiplier circuit connected to the defective column.

4. The compute-in-memory device of claim 3, further comprising:
an array of N memory cells storing the N stored data elements and including the defective column; and
an array of M redundant memory cells storing the M stored redundant data elements, wherein a data element of the N stored data elements originally addressed to a memory cell, of the N memory cells, that is connected to the defective column is provided to a redundant memory cell of the M redundant memory cells as a redundant data element of the M stored redundant data elements, and
wherein the redundancy multiplier circuit (i) multiplies the redundant data element of the redundant memory cell by the value of the particular input data element originally allocated to the multiplier circuit connected to the defective column and (ii) provides a product of the multiplication as a data element of the redundancy multiplier output.

5. The compute-in-memory device of claim 4, wherein the array of N memory cells includes static random access memory (SRAM).

6. The compute-in-memory device of claim 4, wherein the array of N memory cells includes dynamic random access memory (DRAM).

7. The compute-in-memory device of claim 4, wherein the array of N memory cells includes non-volatile memory.

8. The compute-in-memory device of claim 4, further comprising an accumulation circuitry receiving the multiplier output and the redundancy multiplier output and configured to generate a sum of data elements of the received multiplier output and data elements of the received redundancy multiplier output.

9. The compute-in-memory device of claim 3,
wherein the control circuits include buffers for storing values of the N input data elements and values of the M redundancy input data elements, and
wherein the operations include changing the values of the N input data elements and the values of the M redundancy input data elements in dependence upon the indication of the defective column.

10. The compute-in-memory device of claim 1, wherein the N input data elements are activator inputs of a neural network and the N stored data elements are weights of a neural network.

11. The compute-in-memory device of claim 1, wherein the operations further include, responsive to an indication of two defective columns:

providing, to a first redundancy multiplier circuit of the redundancy multiplier circuits, a value of a first particular input data element originally allocated to a multiplier circuit, of the multiplier circuits, connected to a first defective column of the two defective columns;

providing, to a second redundancy multiplier circuit of the redundancy multiplier circuits, a value of a second particular input data element originally allocated to a multiplier circuit, of the multiplier circuits, connected to a second defective column of the two defective columns; and providing a value of zero as an input data element to the multiplier circuit connected to the first defective column and to the multiplier circuit connected to the second defective column.

12. A method of performing operations using a compute-in-memory device including (i) control circuits providing N input data elements and M redundancy input data elements, N and M being integers greater than zero, (ii) multiplier circuits configured to multiply the N input data elements by N stored data elements and provide a multiplier output, and (iii) redundancy multiplier circuits configured to multiply the M redundancy input data elements by M stored redundant data elements and provide a redundancy multiplier output, the method comprising:

providing the N input data elements to the multiplier circuits; and providing the M redundancy input data elements with a value of zero as an input data element to the redundancy multiplier circuits, such that the redundancy multiplier circuits provide a redundancy multiplier output of zero, regardless of a value of the M stored redundant data elements.

13. The method of claim 12, further comprising generating a sum of (i) data elements of the multiplier output and (ii) data elements of the redundancy multiplier output.

14. The method of claim 12, further comprising:

receiving an indication that there is a defective column in a memory array of the compute-in-memory device;

providing, to a redundancy multiplier circuit of the redundancy multiplier circuits, a value of a particular input data element originally allocated to a multiplier circuit, of the multiplier circuits, connected to the defective column; and providing a value of zero as an input data element to the multiplier circuit connected to the defective column.

15. The method of claim 14, wherein the compute-in-memory device further includes an array of N memory cells storing the N stored data elements and including the defective column, and an array of M redundant memory cells storing the M stored redundant data elements, and wherein the method further includes:

providing a data element, of the N stored data elements, originally addressed to a memory cell of the N memory cells that is connected to the defective column to a redundant memory cell of the M redundant memory cells as a redundant data element of the M stored redundant data elements;

multiplying, by the redundancy multiplier circuit, the redundant data element of the redundant memory cell by the value of the particular input data element originally allocated to the multiplier circuit connected to the defective column; and providing, by the redundancy multiplier circuit, a product of the multiplication as a data element of the redundancy multiplier output.

16. The method of claim 12, further comprising:

receiving an indication that there are two defective columns in a memory array of the compute-in-memory device;

providing, to a first redundancy multiplier circuit of the redundancy multiplier circuits, a value of a first particular input data element originally allocated to a multiplier circuit, of the multiplier circuits, connected to a first defective column of the two defective columns;

providing, to a second redundancy multiplier circuit of the redundancy multiplier circuits, a value of a second particular input data element originally allocated to a multiplier circuit, of the multiplier circuits, connected to a second defective column of the two defective columns; and providing a value of zero as an input data element to the multiplier circuit connected to the first defective column and to the multiplier circuit connected to the second defective column.

17. A compute-in-memory device, comprising:

control circuits providing N input data elements and M redundancy input data elements, N and M being integers greater than zero;

multiplier circuits configured to (i) multiply the N input data elements by N stored data elements and (ii) provide a multiplier output; and redundancy multiplier circuits configured to (i) multiply the M redundancy input data elements by M stored redundant data elements and (ii) provide a redundancy multiplier output, wherein the control circuits include logic to execute operations including, responsive to an indication of a defective column in a memory array storing stored data elements:

providing, to a redundancy multiplier circuit of the redundancy multiplier circuits, a value of a particular input data element originally allocated to a multiplier circuit, of the multiplier circuits, connected to the defective column; and providing a value of zero as an input data element to the multiplier circuit connected to the defective column, such that the multiplier circuit connected to the defective column provides a multiplier output of zero for the defective column, regardless of a value of a stored data element of the defective column.

18. The compute-in-memory device of claim 17, further comprising an accumulation circuitry receiving the multiplier output and the redundancy multiplier output and configured to generate a sum of (i) data elements of the received multiplier output and (ii) data elements of the received redundancy multiplier output.

19. The compute-in-memory device of claim 17, further comprising:

an array of N memory cells storing the N stored data elements and including the defective column; and an array of M redundant memory cells storing the M stored redundant data elements, wherein a data element of the N stored data elements originally addressed to a memory cell, of the N memory cells, that is connected to the defective column is provided to a redundant memory cell of the M redundant memory cells as a redundant data element of the M stored redundant data elements, and wherein the redundancy multiplier circuit (i) multiplies the redundant data element of the redundant memory cell by the value of the particular input data element originally allocated to the multiplier circuit connected to the defective column and (ii) provides a product of the multiplication as a data element of the redundancy multiplier output.

20. The compute-in-memory device of claim 17, wherein the operations further include, responsive to an indication of two defective columns:

providing, to a first redundancy multiplier circuit of the redundancy multiplier circuits, a value of a first particular input data element originally allocated to a multiplier circuit, of the multiplier circuits, connected to a first defective column of the two defective columns;

providing, to a second redundancy multiplier circuit of the redundancy multiplier circuits, a value of a second particular input data element originally allocated to a multiplier circuit, of the multiplier circuits, connected to a second defective column of the two defective columns; and providing a value of zero as an input data element to the multiplier circuit connected to the first defective column and to the multiplier circuit connected to the second defective column.

* * * * *